(12) United States Patent
Lim et al.

(10) Patent No.: US 6,967,156 B2
(45) Date of Patent: Nov. 22, 2005

(54) METHOD TO FABRICATE ALIGNED DUAL DAMASCENE OPENINGS

(75) Inventors: Yeow Kheng Lim, Singapore (SG); Wuping Liu, Singapore (SG); Tae Jong Lee, Singapore (SG); Bei Chao Zhang, Singapore (SG); Juan Boon Tan, Singapore (SG); Alan Cuthbertson, Singapore (SG); Chin Chuan Neo, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 48 days.

(21) Appl. No.: 10/690,998

(22) Filed: Oct. 22, 2003

(65) Prior Publication Data
US 2005/0090095 A1    Apr. 28, 2005

(51) Int. Cl.[7] .............................................. H01L 29/06
(52) U.S. Cl. ....................... 438/622; 438/637; 438/737
(58) Field of Search ................ 438/618, 622, 438/637, 700, 738, 740, 737

(56) References Cited
U.S. PATENT DOCUMENTS

| 6,087,252 A | 7/2000 | Lu ............................. 438/638 |
| 6,133,144 A | 10/2000 | Tsai et al. .................... 438/634 |
| 6,350,675 B1 | 2/2002 | Chooi et al. ................. 438/624 |
| 6,380,096 B2 | 4/2002 | Hung et al. .................. 438/723 |
| 2004/0121585 A1 * | 6/2004 | Liu et al. ..................... 438/637 |

* cited by examiner

Primary Examiner—Brad Smith
(74) Attorney, Agent, or Firm—George O. Saile; Rosemary L. S. Pike; Stephen G. Stanton

(57) ABSTRACT

A method of forming an aligned dual damascene opening, comprising including the following sequential steps. A layer stack is formed over the metal structure. The layer stack comprises, in ascending order: a bottom etch stop layer; a lower dielectric material layer; a middle etch stop layer; a middle dielectric material layer; and an upper dielectric layer. A patterned mask layer is formed over the patterned upper dielectric layer leaving exposed opposing portions of the patterned upper dielectric layer. The middle dielectric material layer is patterned to form an opening therein using the patterned mask layer and the exposed portions of the upper dielectric layer as masks. Simultaneously patterning the patterned middle dielectric material layer using the patterned upper dielectric layer as a mask to form an inchoate upper trench opening; and the lower dielectric material layer using the patterned mask layer and the patterned middle etch stop layer as masks to form an inchoate lower via opening aligned with the inchoate upper trench opening.

32 Claims, 3 Drawing Sheets

METHOD TO FABRICATE ALIGNED DUAL DAMASCENE OPENINGS

BACKGROUND OF THE INVENTION

In some dual damascene patterning schemes, after via patterning a via-fill step is used to protect the via bottom from early breakthrough during the subsequent dual damascene trench etch. Organic or inorganic materials, such as bottom anti-reflective coatings (BARC), are commonly used to fill the via.

However, with the continuously shrinkage in feature size, this via-first scheme will face difficulty in finding a suitable via-fill material to achieve bubble-free filling and to effectively remove the via-fill material after etching. Additionally, with the implementation of borderless via structures, masking will also face greater challenges in achieving an aligned dual damascene structure.

U.S. Pat. No. 6,380,096 B1 to Hung et al. describes a via-first process using an anti-reflective coating (ARC) layer.

U.S. Pat. No. 6,350,675 B1 to Chooi et al. describes a process for simultaneously etching a via and a trench using silylated photoresist.

U.S. Pat. No. 6,133,144 to Tsai et al. describes a self-aligned dual damascene process.

U.S. Pat. No. 6,087,252 to Lu describes a process of forming a via plug and an interconnect simultaneously.

SUMMARY OF THE INVENTION

Accordingly, it is an object of the present invention to provide an improved method of fabricating dual damascene openings.

Other objects will appear hereinafter.

It has now been discovered that the above and other objects of the present invention may be accomplished in the following manner. Specifically, structure having a metal structure formed thereover is provided. A layer stack is formed over the metal structure. The layer stack comprises, in ascending order: a bottom etch stop layer; a lower dielectric material layer; a middle etch stop layer; a middle dielectric material layer; and an upper dielectric layer. The upper dielectric layer is patterned to form an opening exposing a portion of the underlying middle dielectric material layer. The opening having a width. A patterned mask layer is formed over the patterned upper dielectric layer leaving exposed opposing portions of the patterned upper dielectric layer. The middle dielectric material layer is patterned to form an opening therein using the patterned mask layer and the exposed portions of the upper dielectric layer as masks. The middle dielectric material layer opening exposing a portion of the middle etch stop layer. The middle etch stop layer is removed at its exposed portion to form a patterned middle etch stop layer having an opening exposing a portion of the lower dielectric material layer. Simultaneously patterning: the patterned middle dielectric material layer using the patterned upper dielectric layer as a mask to form an inchoate upper trench opening; and the lower dielectric material layer using the patterned mask layer and the patterned middle etch stop layer as masks to form an inchoate lower via opening aligned with the inchoate upper trench opening. The inchoate lower via opening exposing a portion of the underlying bottom etch stop layer. The patterned mask layer is removed. The patterned upper dielectric material layer, the exposed portions of the patterned middle etch stop layer and the exposed portion of the bottom etch stop layer are removed to convert: the inchoate upper trench opening into a final upper trench opening; and the inchoate lower via opening into a final lower via opening to form the dual damascene opening.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 1:
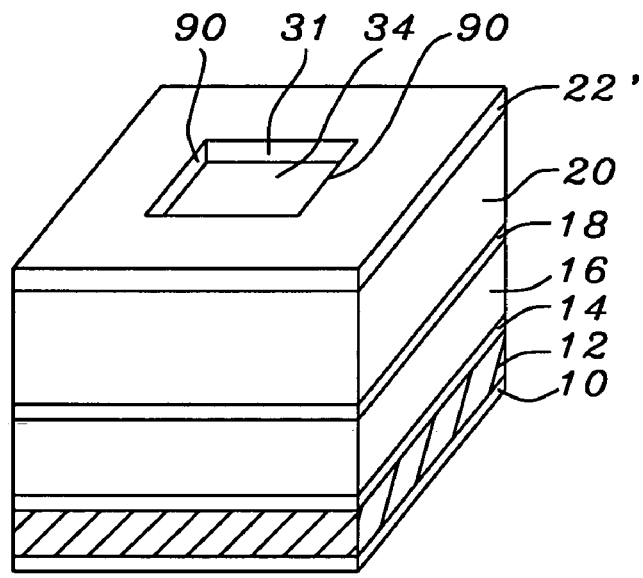
FIGS. 1 to 6 schematically illustrate a preferred embodiment of the present invention.

Initial Structure—FIG. 1

FIG. 1 schematically illustrates a structure 10 having a metal structure 12 formed at least partially thereover to a thickness of preferably from about 1000 to 5000 Å and more preferably from about 2000 to 3000 Å.

Structure 10 is preferably a silicon substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Metal structure 12 is preferably comprised of copper (Cu), aluminum (Al), gold (Au), an aluminum copper alloy (AlCu) or an aluminum silica copper alloy (AlSiCu) and is more preferably copper (Cu) as will be used for illustrative purposes hereafter.

A dielectric layer 14, known hereinafter as bottom etch stop layer (BESL) 14 for ease of illustration, is formed over the Cu structure 12 to a thickness of preferably from about 250 to 1000 Å and more preferably from about 400 to 600 Å. BESL 14 is preferably comprised of a dielectric material such as SiN, SiC, SiCO, SiCN, a combination of SiC(O) and SiC(N) or BLOK and is more preferably a combination of SiC(O) and SiC(N).

Another dielectric layer 16, known hereinafter as an interlevel dielectric (ILD) layer 16 for ease of illustration, is formed over BESL 14 to a thickness of preferably from about 2000 to 6000 Å and more preferably from about 3000 to 5000 Å. ILD layer 16 is preferably comprised of a dielectric material such as FTEOS or other low-k dielectric materials and is more preferably FTEOS or other low-k dielectric materials.

Another dielectric layer 18, known hereinafter as middle etch stop layer (MESL) 18 for ease of illustration, is formed over the ILD layer 16 to a thickness of preferably from about 250 to 1000 Å and more preferably from about 400 to 600 Å. MESL 18 is preferably comprised of a dielectric material such as SiN, SiC(O), SiC(N), a combination of SiC(O) and SiC(N) or BLOK and is more preferably SIN.

Another dielectric layer 20, known hereinafter as an intermetal dielectric (IMD) layer 20 for ease of illustration, is formed over MESL 18 to a thickness of preferably from about 2000 to 6000 Å and more preferably from about 3000 to 5000 Å. IMD layer 20 is preferably comprised of a dielectric material such as FTEOS or other low-k dielectric materials and is more preferably FTEOS or other low-k dielectric materials.

It is noted that ILD layer 16 and IMD layer 20 can be comprised of the same or different materials.

A patterned upper dielectric layer 22' is formed over the IMD layer 20 to a thickness of preferably from about 250 to 1000 Å and more preferably from about 400 to 600 Å. Patterned upper dielectric layer 22 includes a rectangular shaped opening 31 with length-wise ends 90 having a:

- length of preferably from about 0.06 to 0.24 μm and more preferably from about 0.10 to 0.19 μm; and a
- width of preferably from about 0.07 to 0.25 μm and more preferably from about 0.11 to 0.20 μm where the width is greater than the length.

Opening 31 is rectangular-shaped to allow a margin of error for any possible misalignment between the via and trench mask. It is noted that the finally etched via 44 is generally square-shaped.

Opening 31 exposes a rectangular portion 34 of the underlying ILD layer 20 which defines a portion of the subsequent trench opening 102' of the dual damascene opening 50.

Patterned upper dielectric layer 22' is preferably comprised of a dielectric layer such as SiN, SiC(O), SiC(N), a combination of SiC(O) and SiC(N) or BLOK and is more preferably SiN. It is noted that upper dielectric layer 22' may serve as an upper anti-reflective coating.

It is noted that BESL 14, MESL 18 and upper dielectric layer 22' are preferably comprised of the same material.

Figure 2:
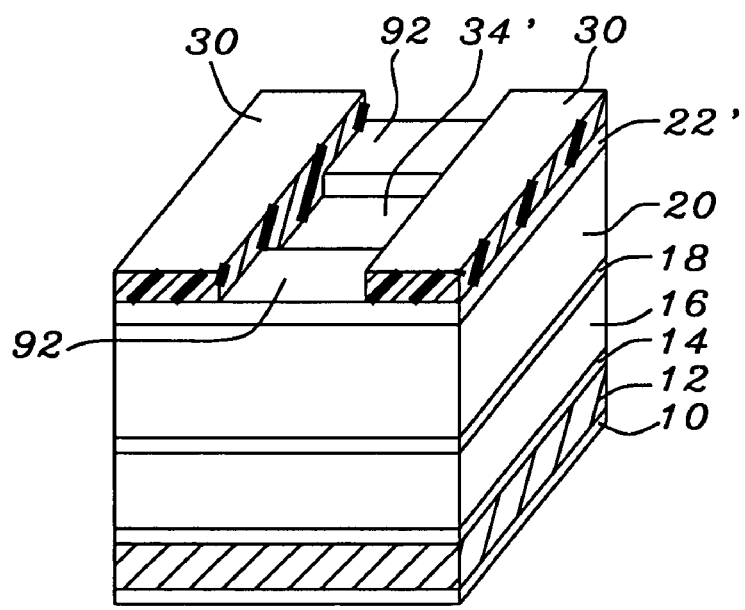

Formation of Patterned Mask Layer 30—FIG. 2

A mask layer 30 is then be formed over the patterned upper dielectric layer 22', the length-wise ends 90 and a portion of the exposed 34 IMD layer 20 so that a roughly square shaped portion 34' of IMD layer 20 is now exposed as well as portions 92 of patterned upper dielectric layer 22'. Square shaped portion 34' is preferably from about 0.06 to 0.241 μm on a side and more preferably from about 0.10 to 0.19 μm on a side which defines the width of the subsequent via opening 44 of the dual damascene opening 50.

Mask layer 30 has a thickness of preferably from about 2000 to 10,000 Å and more preferably from about 3000 to 6000 Å. Second patterned mask layer 30 is preferably comprised of photoresist or DARC and is more preferably photoresist.

Generally, the thickness of layer 30 will be reduced during the via 44 and trench 102' patterning. The initial thickness of layer is selected to have only a minimal remaining layer 30 after the dual damascene opening 49 is formed.

Figure 3:
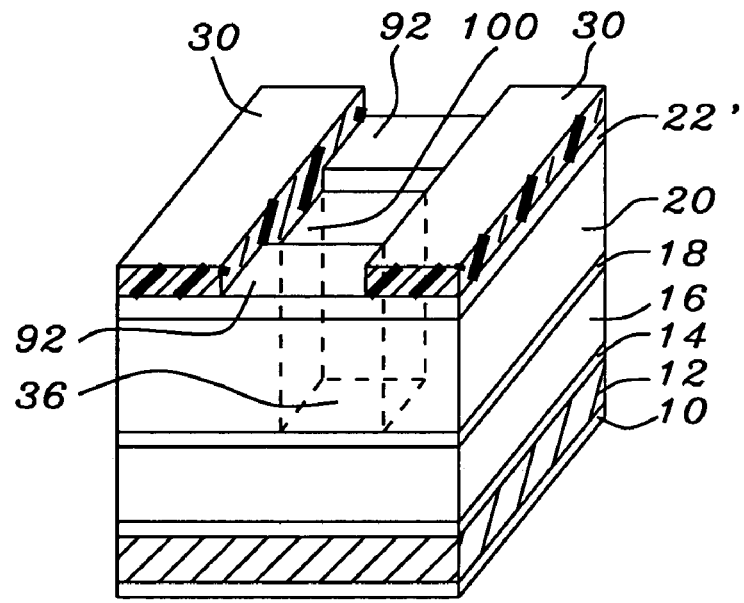

Patterning of ILD Layer 20—FIG. 3

As shown in FIG. 3, ILD layer 20 is patterned at its exposed portion 34' to form patterned ILD layer 20' having an opening 100 exposing a portion 36 of the underlying MESL 18.

Figure 4:
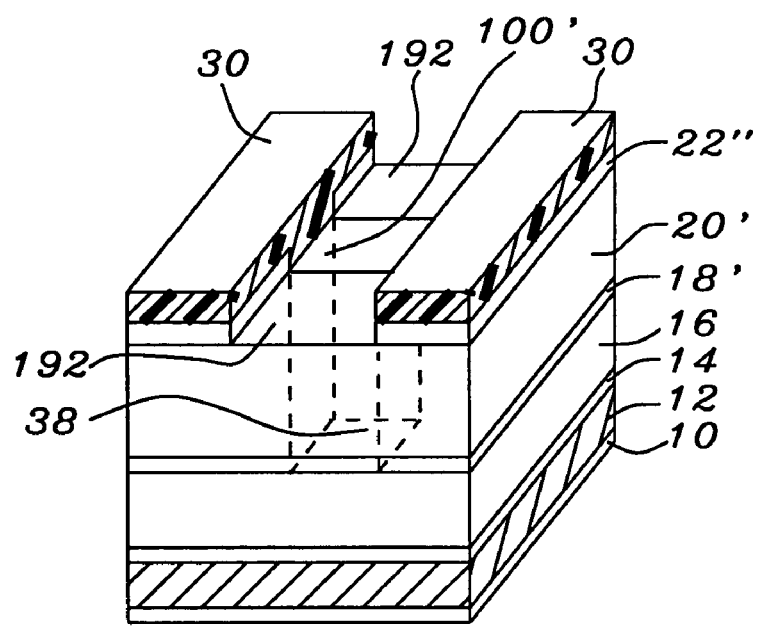

Patterning of MESL 18—FIG. 4

As shown in FIG. 4, MESL 18 is then patterned at its exposed portion 36 to form patterned MESL 18' exposing a portion 38 of underlying ILD layer 16 and formed extended opening 100'. At the same time, portions 92 of layer 22' is also remove to expose underlying portions 192 of layer 20'.

Figure 5:
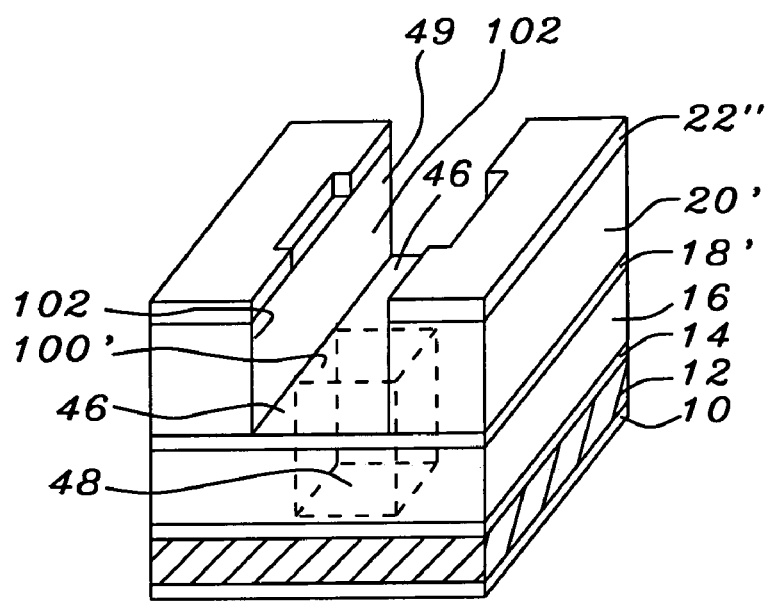

Formation of Dual Damascene Opening 50 and Removal of Patterned Mask Layer 30—FIG. 5

As shown in FIG. 5, using patterned mask layer 30 as a mask: (1) layer 20' is patterned at its exposed portions 192 to expose the underlying portions 46 of layer 18'; and (2) ILD layer 16 is patterned at exposed portion 38 to form patterned ILD layer 16' to expose the underlying portion 48 of BESL 14; and forming inchoate dual damascene opening 49. Dual damascene opening 49 includes inchoate via portion 100" and inchoate trench portion 102.

As noted above, the thickness of patterned mask layer 30 is reduced during the inchoate via portion 100' and inchoate trench portion 102' patterning so that only a minimal portion of patterned mask layer 30 remains.

As shown in FIG. 5, the remaining patterned mask layer 30 is removed and the structure is cleaned as necessary.

Figure 6:
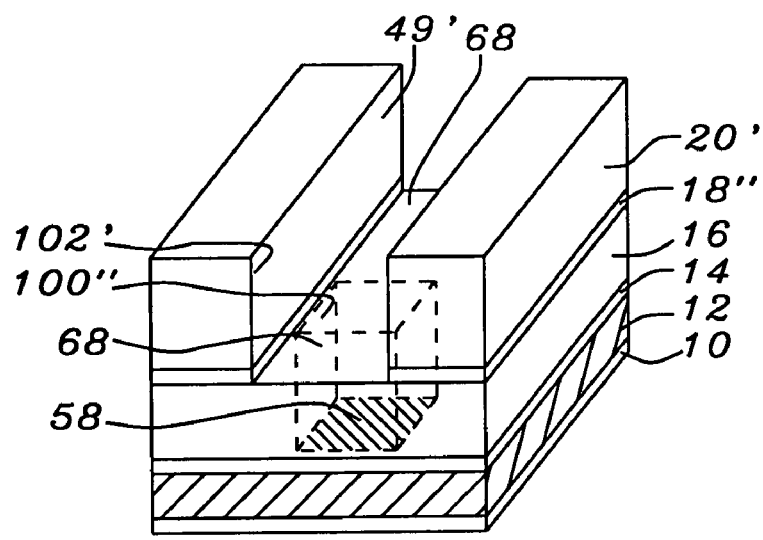

Removal of Patterned Upper Dielectric Layer 22'—FIG. 6

As shown in FIG. 6, the patterned upper dielectric layer 22', the exposed portions 46 of MESL 18' and the exposed portion 48 of BESL 14 are removed to form the final aligned dual damascene opening 49' having: (1) final via opening 100" exposing a portion 58 of metal structure 12; and (2) final trench opening 102' centered over the final via opening 100" and exposing portions 68 of ILD layer 16.

It is noted that the final aligned dual damascene via 100" and trench 102 are fabricated within 'one run' of etch processes which avoids the necessity of using a via-fill material and then having to remove the via-fill material at post-etch. Also, the elongated patterning used herein (i.e. the use of rectangular-shaped opening 31) prevent any possible trench 102 and via 100" misalignment.

Further Processing

Further processing may then proceed by the formation of a planarized dual damascene structure within final dual damascene opening 50, for example. Any planarized dual damascene structure 52 is preferably comprised of copper (Cu), aluminum (Al), gold (Au), an aluminum copper alloy (AlCu) or an aluminum silica copper alloy (AlSiCu) and is more preferably copper (Cu).

ADVANTAGES OF THE INVENTION

The advantages of one or more embodiments of the present invention include:

1) a via-fill in forming a dual damascene opening is avoided;
2) an almost perfectly aligned dual damascene opening is achieved; and
3) the need for a bubble-free via-fill material and the steps required to then remove the bubble-free via-fill material at post-etch are eliminated.

While particular embodiments of the present invention have been illustrated and described, it is not intended to limit the invention, except as defined by the following claims.

We claim:

1. A method of forming an aligned dual damascene opening, comprising the sequential steps of:

providing a structure having a metal structure formed thereover;

forming a layer stack over the metal structure; the layer stack comprising, in ascending order: a bottom etch stop layer; a lower dielectric material layer; a middle etch stop layer; a middle dielectric material layer; and an upper dielectric layer; wherein:

the lower and middle dielectric layers are comprised of the same material; or the bottom etch stop layer, the middle etch stop layer and the upper dielectric layer are comprised of the same material;

patterning the upper dielectric layer to form an opening exposing a portion of the underlying middle dielectric material layer; the opening having a width;

forming a patterned mask layer over the patterned upper dielectric layer leaving exposed opposing portions of the patterned upper dielectric layer;

patterning the middle dielectric material layer to form an opening therein using the patterned mask layer and the exposed portions of the upper dielectric layer as masks; the middle dielectric material layer opening exposing a portion of the middle etch stop layer;

removing the middle etch stop layer at its exposed portion to form a patterned middle etch stop layer having an opening exposing a portion of the lower dielectric material layer;

simultaneously patterning:
the patterned middle dielectric material layer using the patterned upper dielectric layer as a mask to form an inchoate upper trench opening; and
the lower dielectric material layer using the patterned mask layer and the patterned middle etch stop layer as masks to form an inchoate lower via opening aligned with the inchoate upper trench opening; the inchoate lower via opening exposing a portion of the underlying bottom etch stop layer;

removing the patterned mask layer; and removing the patterned upper dielectric material layer, the exposed portions of the patterned middle etch stop layer and the exposed portion of the bottom etch stop layer to convert:
the inchoate upper trench opening into a final upper trench opening; and
the inchoate lower via opening into a final lower via opening;
to form the aligned dual damascene opening.

2. The method of claim 1, wherein the structure is a semiconductor wafer.

3. The method of claim 1, wherein the structure is comprised of silicon or germanium.

4. The method of claim 1, wherein the metal structure is comprised of copper, aluminum, gold, an aluminum copper alloy or an aluminum silica copper alloy; the bottom etch stop layer is comprised of a dielectric material such as SiN, SiC, SiCO, SiCN, a combination of SiC(O) and SiC(N) or BLOK; the lower dielectric material layer is comprised of a dielectric material such as FTEOS or low-k dielectric materials; the middle etch stop layer is comprised of a dielectric material such as SiN, SiC(O), SiC(N), a combination of SiC(O) and SiC(N) or BLOK; the middle dielectric material layer is comprised of a dielectric material such as FTEOS or low-k dielectric materials; and the upper dielectric layer is comprised of a dielectric layer such as SiN, SiC(O), SiC(N), a combination of SiC(O) and SiC(N) or BLOK.

5. The method of claim 1, wherein the metal structure is comprised of copper; the bottom etch stop layer is comprised of a combination of SiC(O) and SiC(N); the lower dielectric material layer is comprised of FTEOS or a low-k dielectric material; the middle etch stop layer is comprised of SiN; the middle dielectric material layer is comprised of FTEOS or a low-k dielectric material; and the upper dielectric layer is comprised of SiN.

6. The method of claim 1, wherein the metal structure has a thickness of from about 1000 to 5000 Å; the bottom etch stop layer has a thickness of from about 250 to 1000 Å; the lower dielectric material layer has a thickness of from about 2000 to 6000 Å; the middle etch stop layer has a thickness of from about 250 to 1000 Å; the middle dielectric material layer has a thickness of from about 2000 to 6000 Å; and the upper dielectric layer has a thickness of from about 250 to 1000 Å.

7. The method of claim 1, wherein the metal structure has a thickness of from about 2000 to 3000 Å; the bottom etch stop layer has a thickness of from about 400 to 600 Å; the lower dielectric material layer has a thickness of from about 3000 to 5000 Å; the middle etch stop layer has a thickness of from about 400 to 600 Å; the middle dielectric material layer has a thickness of from about 3000 to 5000 Å; and the upper dielectric layer has a thickness of from about 400 to 600 Å.

8. The method of claim 1, further including the step of forming a patterned dual damascene structure within the dual damascene opening.

9. The method of claim 1, wherein the opening has a width of from about 0.07 to 0.25 µm.

10. The method of claim 1, wherein the opening has a width of from about 0.11 to 0.20 µm.

11. The method of claim 1, wherein the opening has a width and a length and the width is greater than the length.

12. A method of forming an aligned dual damascene opening, comprising the sequential steps of:
providing a structure having a metal structure formed thereover;
forming a layer stack over the metal structure; the layer stack comprising, in ascending order: a bottom etch stop layer; a lower dielectric material layer; a middle etch stop layer; a middle dielectric material layer; and an upper dielectric layer;
patterning the upper dielectric layer to form a rectangular-shaped opening exposing opposing portions of the underlying middle dielectric material layer; the rectangular-shaped opening having a width and a length;
forming a patterned mask layer over the patterned upper dielectric layer, filling the opposing ends of the length of the rectangular-shaped opening and leaving exposed portions of the patterned upper dielectric layer;
patterning the middle dielectric material layer to form an opening therein using the patterned mask layer and the exposed portions of the upper dielectric layer as masks; the middle dielectric material layer opening exposing a portion of the middle etch stop layer;
removing the middle etch stop layer at its exposed portion to form a patterned middle etch stop layer having an opening exposing a portion of the lower dielectric material layer;
simultaneously patterning:
the patterned middle dielectric material layer using the patterned mask layer and the patterned upper dielectric layer as masks to form an inchoate upper trench opening; and
the lower dielectric material layer using the patterned middle etch stop layer as a mask to form an inchoate lower via opening aligned with the inchoate upper trench opening; the inchoate lower via opening exposing a portion of the underlying bottom etch stop layer;
removing the patterned mask layer; and
removing the patterned upper dielectric material layer, the exposed portions of the patterned middle etch stop layer and the exposed portion of the bottom etch stop layer to convert:
the inchoate upper trench opening into a final upper trench opening; and
the inchoate lower via opening into a final lower via opening;
to form the aligned dual damascene opening.

13. The method of claim 12, wherein the structure is a semiconductor wafer.

14. The method of claim 12, wherein the structure is comprised of silicon or germanium.

15. The method of claim 12, wherein the metal structure is comprised of copper, aluminum, gold, an aluminum copper alloy or an aluminum silica copper alloy; the bottom etch stop layer is comprised of a dielectric material such as SiN, SiC, SiCO, SiCN, a combination of SiC(O) and SiC(N) or BLOK; the lower dielectric material layer is comprised of a dielectric material such as FTEOS or low-k dielectric materials; the middle etch stop layer is comprised of a dielectric material such as SiN, SiC(O), SiC(N), a combination of SiC(O) and SiC(N) or BLOK; the middle dielectric material layer is comprised of a dielectric material such as FTEOS or low-k dielectric materials; and the upper dielectric layer is comprised of a dielectric layer such as SiN, SiC(O), SiC(N), a combination of SiC(O) and SiC(N) or BLOK.

16. The method of claim 12, wherein the metal structure is comprised of copper; the bottom etch stop layer is comprised of a combination of SiC(O) and SiC(N); the lower dielectric material layer is comprised of FTEOS or a low-k dielectric material; the middle etch stop layer is comprised of SiN; the middle dielectric material layer is comprised of FTEOS or a low-k dielectric material; and the upper dielectric layer is comprised of SiN.

17. The method of claim 12, wherein the lower and middle dielectric layers are comprised of the same material.

18. The method of claim 12, wherein the bottom etch stop layer, the middle etch stop layer and the upper dielectric layer are comprised of the same material.

19. The method of claim 12, wherein the metal structure has a thickness of from about 1000 to 5000 Å; the bottom etch stop layer has a thickness of from about 250 to 1000 Å; the lower dielectric material layer has a thickness of from about 2000 to 6000 Å; the middle etch stop layer has a thickness of from about 250 to 1000 Å; the middle dielectric material layer has a thickness of from about 2000 to 6000 Å; and the upper dielectric layer has a thickness of from about 250 to 1000 Å.

20. The method of claim 12, wherein the metal structure has a thickness of from about 2000 to 3000 Å; the bottom etch stop layer has a thickness of from about 400 to 600 Å; the lower dielectric material layer has a thickness of from about 3000 to 5000 Å; the middle etch stop layer has a thickness of from about 400 to 600 Å; the middle dielectric material layer has a thickness of from about 3000 to 5000 Å; and the upper dielectric layer has a thickness of from about 400 to 600 Å.

21. The method of claim 12, further including the step of forming a patterned dual damascene structure within the dual damascene opening.

22. The method of claim 12, wherein the rectangular-shaped opening has a width of from about 0.07 to 0.25 μm and a length of from about 0.06 to 0.24 μm.

23. The method of claim 12, wherein the rectangular-shaped opening has a width of from about 0.11 to 0.20 μm and a length of from about 0.10 to 0.19 μm.

24. A method of forming an aligned dual damascene opening, comprising the sequential steps of:
providing a structure having a metal structure formed thereover;
forming a layer stack over the metal structure; the layer stack comprising, in ascending order: a bottom etch stop layer; a lower dielectric material layer; a middle etch stop layer; a middle dielectric material layer; and an upper dielectric layer;
patterning the upper dielectric layer to form a rectangular-shaped opening exposing opposing portions of the underlying middle dielectric material layer; the rectangular-shaped opening having a width of from about 0.07 to 0.25 μm and a length of from about 0.06 to 0.24 μm;
forming a patterned mask layer over the patterned upper dielectric layer, filling the opposing ends of the length of the rectangular-shaped opening and leaving exposed portions of the patterned upper dielectric layer;
patterning the middle dielectric material layer to form an opening therein using the patterned mask layer and the exposed portions of the upper dielectric layer as masks; the middle dielectric material layer opening exposing a portion of the middle etch stop layer;
removing the middle etch stop layer at its exposed portion to form a patterned middle etch stop layer having an opening exposing a portion of the lower dielectric material layer;
simultaneously patterning:
the patterned middle dielectric material layer using the patterned mask layer and the patterned upper dielectric layer as masks to form an inchoate upper trench opening; and
the lower dielectric material layer using the patterned middle etch stop layer as a mask to form an inchoate lower via opening aligned with the inchoate upper trench opening; the inchoate lower via opening exposing a portion of the underlying bottom etch stop layer;
removing the patterned mask layer; and
removing the patterned upper dielectric material layer, the exposed portions of the patterned middle etch stop layer and the exposed portion of the bottom etch stop layer to convert:
the inchoate upper trench opening into a final upper trench opening; and
the inchoate lower via opening into a final lower via opening;
to form the aligned dual damascene opening.

25. The method of claim 24, wherein the structure is a semiconductor wafer.

26. The method of claim 24, wherein the structure is comprised of silicon or germanium.

27. The method of claim 24, wherein the metal structure is comprised of copper, aluminum, gold, an aluminum copper alloy or an aluminum silica copper alloy; the bottom etch stop layer is comprised of a dielectric material such as SiN, SiC, SiCO, SiCN, a combination of SiC(O) and SiC(N) or BLOK; the lower dielectric material layer is comprised of a dielectric material such as FTEOS or low-k dielectric materials; the middle etch stop layer is comprised of a dielectric material such as SiN, SiC(O), SiC(N), a combination of SiC(O) and SiC(N) or BLOK; the middle dielectric material layer is comprised of a dielectric material such as FTEOS or low-k dielectric materials; and the upper dielectric layer is comprised of a dielectric layer such as SiN, SiC(O), SiC(N), a combination of SiC(O) and SiC(N) or BLOK.

28. The method of claim 24, wherein the metal structure is comprised of copper; the bottom etch stop layer is comprised of a combination of SiC(O) and SiC(N); the lower dielectric material layer is comprised of FTEOS or a low-k dielectric material; the middle etch stop layer is comprised of SiN; the middle dielectric material layer is comprised of FTEOS or a low-k dielectric material; and the upper dielectric layer is comprised of SiN.

29. The method of claim 24, wherein the metal structure has a thickness of from about 1000 to 5000 Å; the bottom etch stop layer has a thickness of from about 260 to 1000 Å; the lower dielectric material layer has a thickness of from about 2000 to 6000 Å; the middle etch stop layer has a thickness of from about 250 to 1000 Å; the middle dielectric material layer has a thickness of from about 2000 to 6000 Å; and the upper dielectric layer has a thickness of from about 250 to 1000 Å.

30. The method of claim 24, wherein the metal structure has a thickness of from about 2000 to 3000 Å; the bottom etch stop layer has a thickness of from about 400 to 600 Å; the lower dielectric material layer has a thickness of from about 3000 to 5000 Å; the middle etch stop layer has a thickness of from about 400 to 600 Å; the middle dielectric material layer has a thickness of from about 3000 to 5000 Å; and the upper dielectric layer has a thickness of from about 400 to 600 Å.

31. The method of claim 24, further including the step of forming a patterned dual damascene structure within the dual damascene opening.

32. The method of claim 24, wherein the rectangular-shaped opening has a width of from about 0.11 to 0.20 $\mu$m and a length of from about 0.10 to 0.19 $\mu$m.

* * * * *

UNITED STATES PATENT AND TRADEMARK OFFICE
CERTIFICATE OF CORRECTION

PATENT NO. : 6,967,156 B2
DATED : November 22, 2005
INVENTOR(S) : Lim et al.

It is certified that error appears in the above-identified patent and that said Letters Patent is hereby corrected as shown below:

<u>Title page,</u>
Item [75], Inventors, delete "Alan Cuthbertson, Singapore (SG)", and replace with
-- Alan Cuthbertson, Newcastle Upon Tyne, United Kingdom --.

Signed and Sealed this

Seventh Day of March, 2006

JON W. DUDAS
*Director of the United States Patent and Trademark Office*